United States Patent
Casey et al.

[11] Patent Number: 6,032,683
[45] Date of Patent: Mar. 7, 2000

[54] SYSTEM FOR CLEANING RESIDUAL PASTE FROM A MASK

[75] Inventors: Jon A. Casey, Poughkeepsie; Michael E. Cropp, Lagrangeville; Donald W. DiAngelo, Fishkill; John F. Harmuth, Pleasant Valley; John U. Knickerbocker, Hopewell Junction; David C. Long, Wappingers Falls; Daniel S. Mackin, Pleasant Valley; Glenn A. Pomerantz, Kerhonkson; Krishna G. Sachdev, Hopewell Junction, all of N.Y.; David E. Speed, Newtown, Conn.; Candace A. Sullivan; Robert J. Sullivan, both of Pleasant Valley, N.Y.; Bruce E. Tripp, Rhinebeck, N.Y.; James C. Utter, Fishkill, N.Y.

[73] Assignee: International Business Machines Corporation, Armonk, N.Y.

[21] Appl. No.: 09/258,970

[22] Filed: Feb. 26, 1999

Related U.S. Application Data

[62] Division of application No. 09/021,046, Feb. 9, 1998, Pat. No. 5,916,374.

[51] Int. Cl.[7] ...................................................... B08B 3/00
[52] U.S. Cl. ........................... 134/199; 134/61; 134/200; 134/64 R; 134/112 R
[58] Field of Search ............................ 134/61, 95.1, 133, 134/200, 64 R, 122 R, 199; 15/308, 302, 303, 310, 77

[56] References Cited

U.S. PATENT DOCUMENTS

| 20,359 | 5/1858 | Robertson | 134/11 |
|---|---|---|---|
| 875,614 | 8/1907 | Filhol | 134/11 |
| 1,987,586 | 1/1935 | Dinley | 134/11 |
| 4,483,040 | 11/1984 | Magee et al. | 15/302 |
| 4,569,695 | 2/1986 | Yamashita et al. | 134/1 |
| 4,694,524 | 9/1987 | Yoshizawa | 15/308 |
| 4,753,735 | 6/1988 | Figiel | 210/664 |
| 4,847,004 | 7/1989 | McLeod | 252/527 |
| 5,114,494 | 5/1992 | Remec | 134/1 |
| 5,747,439 | 5/1998 | Dunn et al. | 510/255 |
| 5,759,289 | 6/1998 | Caron et al. | 134/34 |

*Primary Examiner*—Randy Gulakowski
*Assistant Examiner*—Paul J. Lee
*Attorney, Agent, or Firm*—Ratner & Prestia; Tiffany L. Townsend

[57] ABSTRACT

A cleaning method and related apparatus for cleaning semiconductor screening masks using an aqueous alkali detergent solution applied under high pressure simultaneously from both sides of the mask, followed by a drying step that uses air knives to blow off the mask surface any residual cleaner solution.

8 Claims, 2 Drawing Sheets

SYSTEM FOR CLEANING RESIDUAL PASTE FROM A MASK

This application is a divisional of U.S. patent application Ser. No. 09/021,046, now U.S. Pat. No. 5,916,374 filed on Feb. 9, 1998, which has been allowed.

BACKGROUND OF THE INVENTION

This invention relates to a system for cleaning masks used for screening a pattern on a surface, such as a semiconductor substrate and more particularly to a system for cleaning such masks using an aqueous cleaning solution.

In the manufacturing of multilayer ceramic substrates, a metal paste is applied to a cast ceramic substrate material via a screening process, This screening process squeegees metal paste material through a metal screen mask onto the ceramic substrate. Periodically, the metal masks need to be cleaned of residual metal paste. Historically, this cleaning process utilizes solvents to dissolve the metal paste on the mask and flush it off.

U.S. Pat. No. 4,483,040 issued Nov. 20, 1984, to Magee et al. and assigned to the assignee of the present application discusses in detail some of the problems encountered when attempting to clean the build up of excess metal paste on a mask. Typically, a combination solvent wash followed by an air knife solvent stripping and drying operation is suggested, with the solvent being an organic solvent such a perchloroethylene. Typical problems encountered by the prior art are (a) the use of an organic solvent which presents substantial health hazards and which must therefore not be vented or allowed to escape in the environment, and (b) the production of waste products containing molly and paste remnants in combination with perchloroethylene residue. Such waste product presents disposal problems as it is toxic, and as a result disposal becomes expensive.

In the past, aqueous type solvents have been tried with limited success. When water is used as the main constituent of the solvent, the chemical cleaning action is less efficient, requiring stronger mechanical action to completely clear the residue, particularly from recessed portions of the mask. The stronger mechanical action often results in physical damage to the masks. A second problem is the required drying time which, for water, is substantially longer than for perchloroethylene.

There is thus still a need for a cleaning system for masks which employs an acceptable solvent replacement to perchloroethylene, which can rapidly and efficiently clean and dry a mask in a time which is comparable to the time needed when perchloroethylene is used. Preferably, such a system would also solve the toxic waste problem present when perchloroethylene or similar organic solvents are used.

SUMMARY OF THE INVENTION

It has now been discovered that the above problems may be circumvented through the use of a cleaning system which employs a combination of an alkaline detergent such as an aqueous solution of Sodium Phosphate or Sodium Metasilicate as a replacement for the organic solvent of the prior art, applied as a balanced, high pressure spray to assist the removal of residual metal paste. This step is followed by an air knife solvent removal step which rapidly blows off residual solvent from the mask surface to deliver a clean and dry mask in a time comparable to that of systems using perchloroethylene solvent.

More particularly, the present invention comprises a method for cleaning a mask having a front and a back surface and four edges using the following sequence of steps:

a) Supporting the mask vertically such that one of said four edges is a top edge;

b) simultaneously spraying with an aqueous alkaline cleaning solution both the front and the back surface of the mask by directing balanced front and back streams of said alkaline solution to impinge on the front and back surface of the mask respectively at an angle of between about 40° and about 50° on the front and back surface of the mask respectively, and at a pressure of between about 150 and 500 psi, beginning at one edge of the mask and ending at an opposite edge; and c) removing any residual liquid from the mask by traversing a front and a back air-knife beginning at one edge of the mask and ending at an opposite edge, wherein the front and back air-knives apply two balanced, heated, gaseous streams simultaneously to both front and back surfaces of the mask at a temperature of about 200° F. and at a pressure of about 80 psi.

Preferably, the step of simultaneously spraying the mask includes traversing in tandem the front and back streams relative to the front and back surface beginning at one edge of the mask and ending at an opposite edge.

Also preferably, the front and back streams of said alkaline cleaning solution are in the form of liquid jets, where the liquid comprises an alkali detergent consisting essentially of an aqueous solution of relatively low concentration of either Sodium Phosphate or Sodium Metasilicate.

Also preferably, the step of spraying alkali detergent simultaneously to the front and back surface of the mask with a first set of balanced front and back streams, which may be in the form of liquid jets, is immediately followed by a second spraying step using the same alkali detergent and sprayed on the mask by a second set of balanced front and back streams, which may also be in the form of jets, each liquid jet in the second set impinging at an angle of about 80° on the front and back surface of the mask respectively, and at a pressure of between about 150 and 500 psi.

To implement this method, the system may comprise apparatus to clean such mask, the apparatus comprising:

A) a source of an alkali detergent;

B) a wash chamber and within said chamber:
1) at least one pair of primary opposing liquid spray nozzles movably mounted within the wash chamber;
2) a drive for moving said spray nozzles in tandem in a vertical path within said chamber;

C) said opposing spray nozzles oriented to direct liquid streams toward each other at an angle of between about 40° and about 50° to the vertical;

D) a pump connected to said source of alkali detergent and said at least one pair of opposing spray nozzles said pump generating the liquid streams at a pressure of between 150 and 500 psi;

E) a drying chamber adjacent said wash chamber, comprising:
1) an air knife supplying two symmetrically opposing gaseous streams directed toward each other; and F) a vertical mask support attached to a transport in said wash and drying chambers located so as to support and transport a mask along a path substantially centered between said opposing liquid spray nozzles and said opposing gaseous streams.

The above equipment may further include at least one secondary pair of opposing nozzles oriented to direct liquid streams of the alkali detergent toward each other and at an angle of about 80° to the vertical,

DETAILED DESCRIPTION OF THE INVENTION

Figure 1:
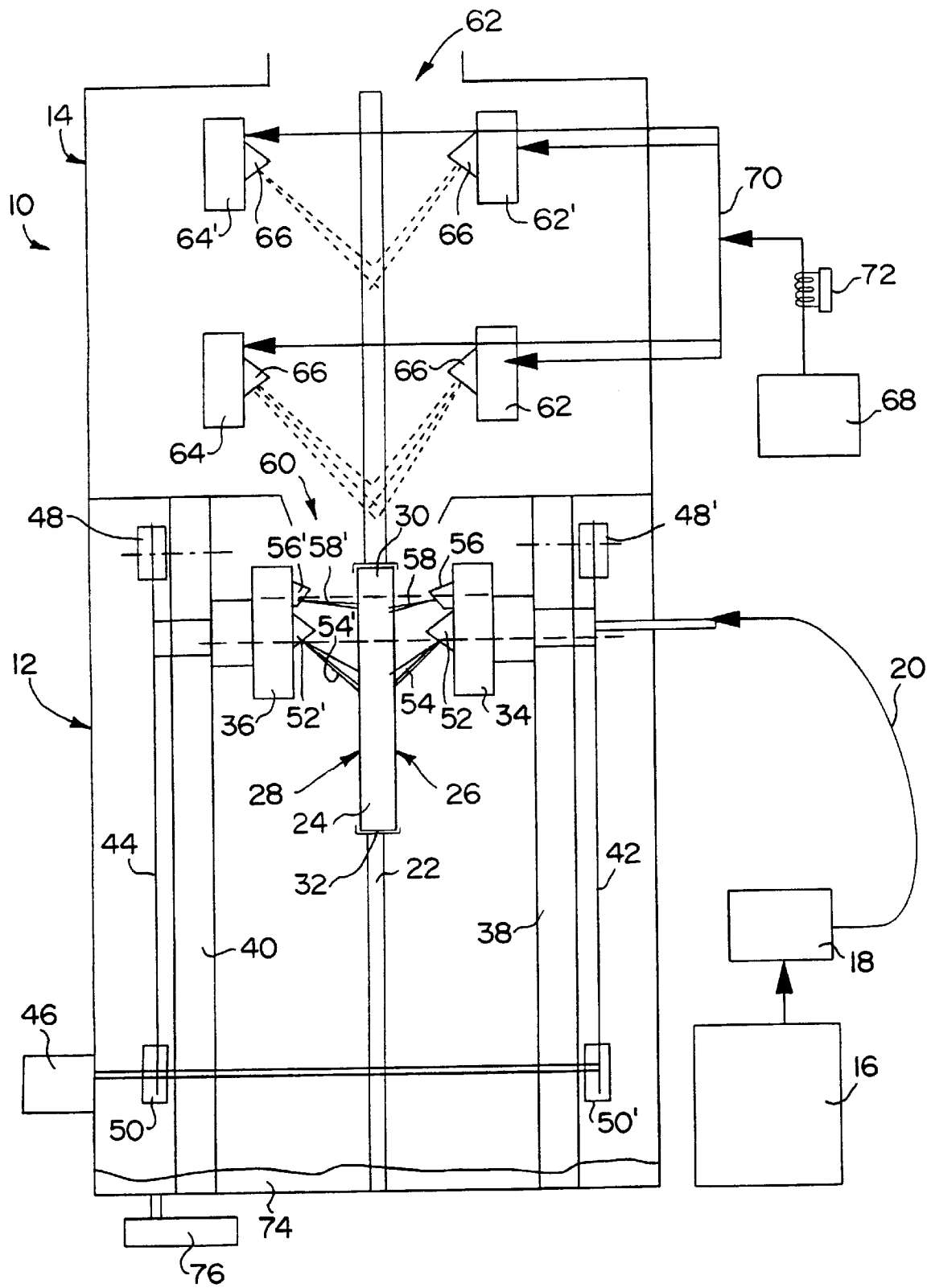
FIG. 1 is a schematic diagram of an apparatus for practicing the process of the present invention.

The invention will next be illustrated with reference to the figures wherein similar numbers represent similar features or elements in all figures.

According to the present invention, a mask of the type used for screening a pattern on a substrate, particularly a substrate used in manufacturing a semiconductor element, may be cleaned after repeated use using an aqueous detergent solution which comprises a water based solution of Sodium Phosphate or Sodium Metasilicate.

The cleaning process involves a combination of a chemical action with vigorous mechanical scrubbing. The high pH solution reacts with the fatty acids in the paste compound to produce salts which are more soluble in the water used in the cleaning solution. This process is enhanced by heating the cleaning solution and applying the solution to the mask at a high temperature. The mechanical scrubbing action on the other hand is accomplished with high pressure liquid streams or jets of cleaner solution directed to the mask front and back surfaces at an incidence angle of about between 40° and 50°, and preferably at 45°.

Such alkaline cleaner composition when delivered as a high pressure liquid stream at an angle between 40° and 50° to the surface of the mask, effectively displaces the residual hydrocarbon paste material off the mask surface.

The pressure at which the cleaning solution is applied to the mask surface is between about 150 psi and 500 psi., and preferably 190 psi. In order to prevent damage to the mask by the high pressure stream impinging on the mask surface, the cleaner solution, according to this invention, is applied simultaneously to both the front and back surface of the mask using a set of balanced front and back liquid streams or jets. By balanced front and back streams it is meant that the liquid streams on either side of the mask deliver liquid to the mask surfaces at substantially the same angle, pressure and liquid flow rate. The liquid streams also are directed to impinge on the front and back surfaces of the mask at substantially the same point from opposite sides. In this manner, the streams tend to balance each other and support the mask, preventing any mask damage.

The cleaning solution is preferably applied hot, that is at a temperature above room temperature, preferably about 200° F.

In a preferred embodiment, this first application of the liquid cleaner is followed immediately by a second cleaner application using a second set of balanced front and back streams or jets of liquid cleaner, again at high pressure and temperature. This second set of balanced front and back liquid streams, however, directs liquid cleaner to the mask front and back surfaces at an incidence angle of between 75° and 85° to the mask surface and preferably at an angle of 80° to the surface.

As previously mentioned, this second set of balanced front and back liquid streams impinge on the front and back surfaces of the mask at the same point so as to again support the mask against damage from the high pressure liquid stream of cleaner solution.

The chemical composition of the cleaner solution is relatively straightforward, comprising a aqueous solution of Sodium Phosphate, Sodium Metasilicate, or combinations of the two, in molar concentrations of from about 0.025 to 0.075. The cleaner solution may also contain a dispersant agent to further aid the cleaning process.

A problem encountered when using an aqueous cleaner solution in cleaning masks, is the drying time required for the mask to be ready for use, since water evaporates much slower than most of the organic solvents typically used in cleaning masks, such as perchloroethylene. This problem is solved in the present invention by, instead on relying primarily on evaporation of the water from the mask surface, using an air-knife to blow most of the water off the surface of the mask.

Preferably, the air blown through the air knife is at a high temperature, for instance between 150° F. and 200° F., 200° F. being the preferred temperature. This operation preferably occurs with the mask being transported vertically between opposed and balanced air knife jets applying hot air at a pressure of about 60 to 100 psi. In the preferred embodiment, four air knives, two on each side of the mask surface are used, to apply two balanced air jets sequentially to both sides of a vertically traveling mask, at a pressure of 80 psi and an air jet temperature of 200° F. The air knives on either side of the mask surface are spaced in the direction of the mask travel. This drying arrangement results in mask drying times which are similar to the times obtained when drying perchloroethylene based cleaners from the mask surface.

Referring now to FIG. 1, there is shown an apparatus 10 in schematic representation, useful for practicing this invention. The apparatus comprises a number of well known hydraulic, electrical and mechanical features, such as fluid containers, pumps, piping and associated fluid distribution valves, start and stop controls, motors and gears associated with mechanical systems for holding a mask in place and for transporting a mask from one stage to another in the practice of this process. Unless a particular element in the system is of significance to the practice of this invention and is not an item as would be usually available in commerce for use in similar applications as the application applied to in this invention, no further description will be provided herein except as is necessary to understand the present invention, The apparatus comprises two chambers. A wash chamber 12 and a drying chamber 14. A source 16 of an alkali detergent is connected to the wash chamber 12 through a high pressure pump 18 and a liquid distribution system 20, A vertical mask support 22 holds a mask 24 vertically in the wash chamber. The mask has a front 26 surface and a back 28 surface. It is bound by four edges, and is supported so that one edge is an uppermost or top edge 30 and an opposite edge being the lowermost or bottom edge 32.

Also within the wash chamber 12 there are mounted two spray nozzle supports, front nozzle support 34 and back nozzle support 36. The nozzle supports are mounted on a nozzle transport system which comprises a pair of guides 38 and 40 which guide the nozzle supports 34 and 36 along a path parallel to the front and back surfaces of the mask 24 supported in the wash chamber on the vertical mask support 22. The nozzle supports 34 and 36 are driven along guides 38 and 40 with a drive system which is depicted in FIG. 1 as comprising a motor 46, a set of upper gears 48 and 48', a set of lower gears 50 and 50' and a chain drive 42 and 44 to which the nozzle supports 34 and 36 are attached in a manner such that both move simultaneously up and down the guides 38 and 40.

The system described is only for purposes of illustration of the present invention, and any other system capable of holding the mask in a vertical position within a wash chamber, and of moving the two opposing nozzle supports in tandem up and down along the mask surface may be used, Furthermore, in a not illustrated embodiment, the nozzle supports may be fixed and the mask may be supported and moved along a path such that the mask surface passes completely through a stationary spray zone defined by the stationary nozzles. It is also possible that the relative movement of the nozzle support with respect to the mask surface be, instead of from top to bottom, from left to right or vice versa. What is important however, is that the mask is subjected to the cleaning action of the liquid streams from one end to the opposite end.

Figure 2:
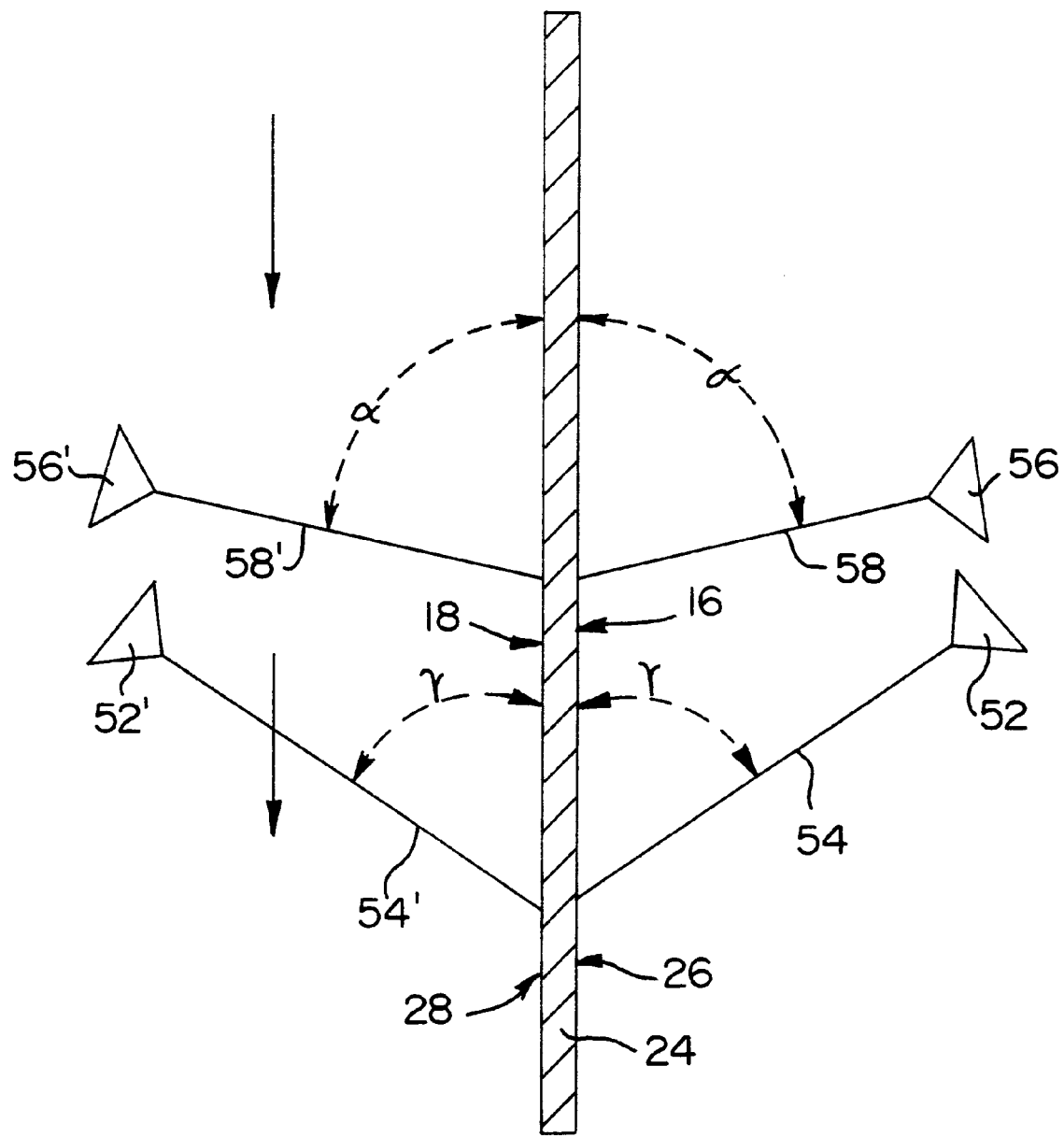
FIG. 2 is an enlarged diagrammatic representation of the flow from the first and second set of balanced front and back streams to the front and back surface of a mask according to the present invention.

A first set of liquid spray nozzles comprising a plurality of nozzles 52 and 52' is mounted on the nozzle supports 34 and 36 to form the first set of balanced front and back liquid jets 54 and 54' directed to impinge simultaneously on the front and back surfaces 26 and 28 of the mask. As better shown in FIG. 2, the liquid jets which move in the direction of the arrows, are directed to impinge on the mask surface at an angle γ which may be between 40° and 50° but is preferably set at 45° relative to the mask surface.

The nozzles 52 and 52' are selected to produce a high pressure fan type liquid jet which provides uniform coverage along the mask surface and good scrubbing action. In a preferred embodiment, the nozzles used have a circular orifice of 26 mils diameter.

This first set of balanced front and back liquid jets are adjusted to impinge on the mask surface from both sides simultaneously at the same point on the front and back surface. The liquid flow rate is regulated to be substantially the same in both the front and the back jet. This way the cleaning solution is applied at the required high pressure and at the same time supports the mask, mutually canceling the effect of the force of the liquid applied from each side.

While a single set of nozzles is adequate to clean a mask, it is preferred to have secondary set of nozzles 56 and 56' mounted on the nozzle support adjacent the primary set of nozzles and placed so that they supply a second set of balanced front and back liquid jets 58 and 58' to the mask immediately following the application of the first set of liquid jets 54 an 54'. The orientation of these secondary nozzles is such that the second set of front and back liquid jets impinges on the mask front and back surfaces at an angle α of about 75° to 85° and preferably at an angle of about 80°.

The drying chamber 14 is located above the wash chamber 12 and communicates therewith through an opening 60. The mask support 22 is such as to enable the mask to be transported vertically through the opening 60 into the drying chamber 14 and therefrom emerge through opening 62 dry and ready for use. No details of such support and transport mechanism are shown to avoid over complicating the drawing. No particular transport is contemplated other than what is often found in equipment used in similar application where the solvent may be a hydrocarbon, as is common in the art.

The drying chamber comprises one and preferably two sets of stationary air knives located along the path of the mask. Each set of air-knives comprises a front and a back air knife 62 and 64 respectively each air-knife comprising a plurality of air nozzles 66. An air supply 68 able to supply air at a pressure of between 50 psi and 100 psi is connected through a manifold 70 to the air nozzles and supplies air at a pressure sufficient to blow off the water from the surface of the mask as the mask is transported between the air knives.

As is done in the case of the liquid jets, the air knives are positioned opposite each other so that air blown onto the mask front and back surfaces impinges on the surfaces at the same point. Again, the air flow and pressure of the air streams is balanced so that the net forces on the mask surface tending to deflect the mask are substantially zero. A heater 72 may be optionally and preferably used to preheat the air prior to impingement on the mask surface to a temperature above 150° F.

When air is impinged onto the surface at a temperature of 200° F. and a pressure of 80 psi, it has been found that a mask may be washed and dried in about 10 seconds, a time comparable to the times obtained when using a hydrocarbon solvent such as perchloroethylene.

In operation, a mask 24 to be cleaned is mounted on support 22 and moved to the cleaning position in wash chamber 12. The pump 18 is activated and heated cleaning solution from the tank 16 flows to the nozzles 52, 52', 56 and 56' creating the first set of liquid jets 54 and 54' and the second set of liquid jets 58 and 58'. Under the control of motor 46 the spraying nozzles begin traversing the mask from top to bottom. The liquid jets in a combined chemical and mechanical action dissolve and dislodge the residual paste from the mask. Cleaner and paste 74, flow under gravity to the bottom of the wash chamber where they are collected in container 76 and eventually removed for disposal.

After the nozzles have traversed the mask from top to bottom, the cleaner flow is terminated and the mask transported through the drying chamber past the two sets of air knives. Hot air from the air-knives blows most of the liquid still on the mask surfaces downwardly through opening 60 into the bottom of the wash tank. Any remaining liquid on the mask surface evaporates rapidly under the exposure to the hot air flowing from the air knives, Those skilled in the art having the benefit of the teachings of the present invention as hereinabove set forth, can effect numerous modifications thereto. These modifications are to be construed as being encompassed within the scope of the present invention as set forth in the appended claims.

What is claimed:

1. Apparatus for cleaning residual paste from a mask, the apparatus comprising:
   A) a source of an alkali detergent;
   B) a wash chamber and within said chamber:
      1) at least one pair of primary opposing liquid spray nozzles movably mounted within the wash chamber;
      2) a drive for moving said spray nozzles in tandem in a vertical path within said chamber;
   C) said opposing spray nozzles oriented to direct balanced front and back liquid streams of said alkali detergent toward each other at an angle of between about 40 and about 50 degrees to the vertical;
   D) a pump connected to said source of alkali detergent and said at least one pair of opposing spray nozzles, said pump generating a pressure in the liquid streams of between 150 and 500 psi;
   E) a drying chamber adjacent said wash chamber, comprising:
      1) an air knife supplying two symmetrically opposing gaseous streams directed toward each other; and
   F) a vertical mask support attached to a transport in said wash and drying chambers located so as to support and transport a mask along a path substantially centered between said opposing liquid spray nozzles and said opposing gaseous streams.

2. Apparatus according to claim 1 wherein said liquid streams are in the form of liquid jets.

3. Apparatus according to claim 1 wherein the balanced front and back liquid streams are a first set of balanced front and back liquid streams and there is at least one secondary pair of spray nozzles to direct a second set of balanced front and back liquid streams toward each other at an angle of between about 75 and about 85 degrees to the vertical, said secondary nozzles mounted adjacent said primary nozzles so that the second set of liquid streams impinges on the mask surface behind the first set of liquid streams.

4. Apparatus according to claim 1 further comprising a heater for raising the temperature of the liquid stream to between about 150° F. and about 200° F.

5. Apparatus according to claim 1 further comprising a heater for raising the temperature of the gaseous stream to above room temperature.

6. Apparatus according to claim 1 wherein the heater raises the gaseous stream temperature to about 200° F.

7. The apparatus according to claim 1 wherein said alkali detergent consists essentially of an aqueous solution of one of sodium phosphate and sodium metasilicate in a molar concentration of between about 0.025 and 0.075.

8. The apparatus according to claim 7 wherein said alkali detergent further comprises a dispersant agent.

* * * * *

UNITED STATES PATENT AND TRADEMARK OFFICE
CERTIFICATE OF CORRECTION

PATENT NO. : 6,032,683
DATED : March 7, 2000
INVENTOR(S) : Jon A. Casey et al.

It is certified that error appears in the above-indentified patent and that said Letters Patent is hereby corrected as shown below:

On the cover page, under item [56], References Cited, delete "U.S. Patent 875,614," and insert under the heading, Foreign Patent Documents, —875,614 8/1961 United Kingdom—.

On the cover page, under item [56], References Cited, U.S. Patent Documents, delete "20,359 5/1858," and insert —RE20,359 5/1937—.

On the cover page, under item [56], References Cited, U.S. Patent Documents, delete "4,694,524", and insert —4,694,527—.

In column 8, claim 6, line 1, delete "claim 1" and insert --claim 5--.

Signed and Sealed this

Twenty-seventh Day of March, 2001

*Attest:*

*Attesting Officer*

NICHOLAS P. GODICI

*Acting Director of the United States Patent and Trademark Office*